United States Patent [19]

Wojnarowski et al.

[11] Patent Number: 5,258,647
[45] Date of Patent: Nov. 2, 1993

[54] ELECTRONIC SYSTEMS DISPOSED IN A HIGH FORCE ENVIRONMENT

[75] Inventors: Robert J. Wojnarowski, Ballston Lake; Charles W. Eichelberger, Schenectady, both of N.Y.

[73] Assignee: General Electric Company, Schenectady, N.Y.

[21] Appl. No.: 936,712

[22] Filed: Aug. 26, 1992

Related U.S. Application Data

[63] Continuation of Ser. No. 586,330, Sep. 18, 1990, abandoned, which is a continuation of Ser. No. 374,890, Jul. 3, 1989, abandoned.

[51] Int. Cl.⁵ .......................................... H01L 29/78
[52] U.S. Cl. .................................. 257/687; 257/704
[58] Field of Search ......................... 357/74, 80, 75; 257/657, 704, 683

[56] References Cited

U.S. PATENT DOCUMENTS

| | | | |
|---|---|---|---|
| 4,117,508 | 9/1978 | Koenig | 257/678 |
| 4,477,828 | 10/1984 | Scherer | 257/687 |
| 4,649,418 | 3/1987 | Uden | 357/80 |
| 4,656,499 | 4/1987 | Butt | 357/74 |
| 4,783,695 | 11/1988 | Eichelberger et al. | 357/65 |
| 4,796,077 | 1/1989 | Takeda et al. | 357/67 |
| 4,812,897 | 3/1989 | Narita et al. | 357/72 |
| 4,839,713 | 6/1989 | Teraoka et al. | 357/70 |
| 4,901,136 | 2/1990 | Neugebauer et al. | 357/75 |
| 4,903,042 | 6/1990 | Eichelberger et al. | 156/239 |
| 4,962,415 | 10/1990 | Yamamoto et al. | 257/687 |

FOREIGN PATENT DOCUMENTS 8802552 4/1988 PCT Int'l Appl. ................... 357/75

Primary Examiner—Jerome Jackson
Assistant Examiner—Stephen D. Meier
Attorney, Agent, or Firm—Marvin Snyder; Geoffrey H. Krauss

[57] ABSTRACT

A high acceleration object includes an electronic system which is operable at accelerations in excess of 20,000 g. Connections between integrated circuit chips and other portions of the electronic system are provided by metallization patterns disposed on polymer dielectric layers which are self-supporting across gaps between components. A high density interconnect structure is disposed within the cavity of a hermetically sealed package.

8 Claims, 8 Drawing Sheets

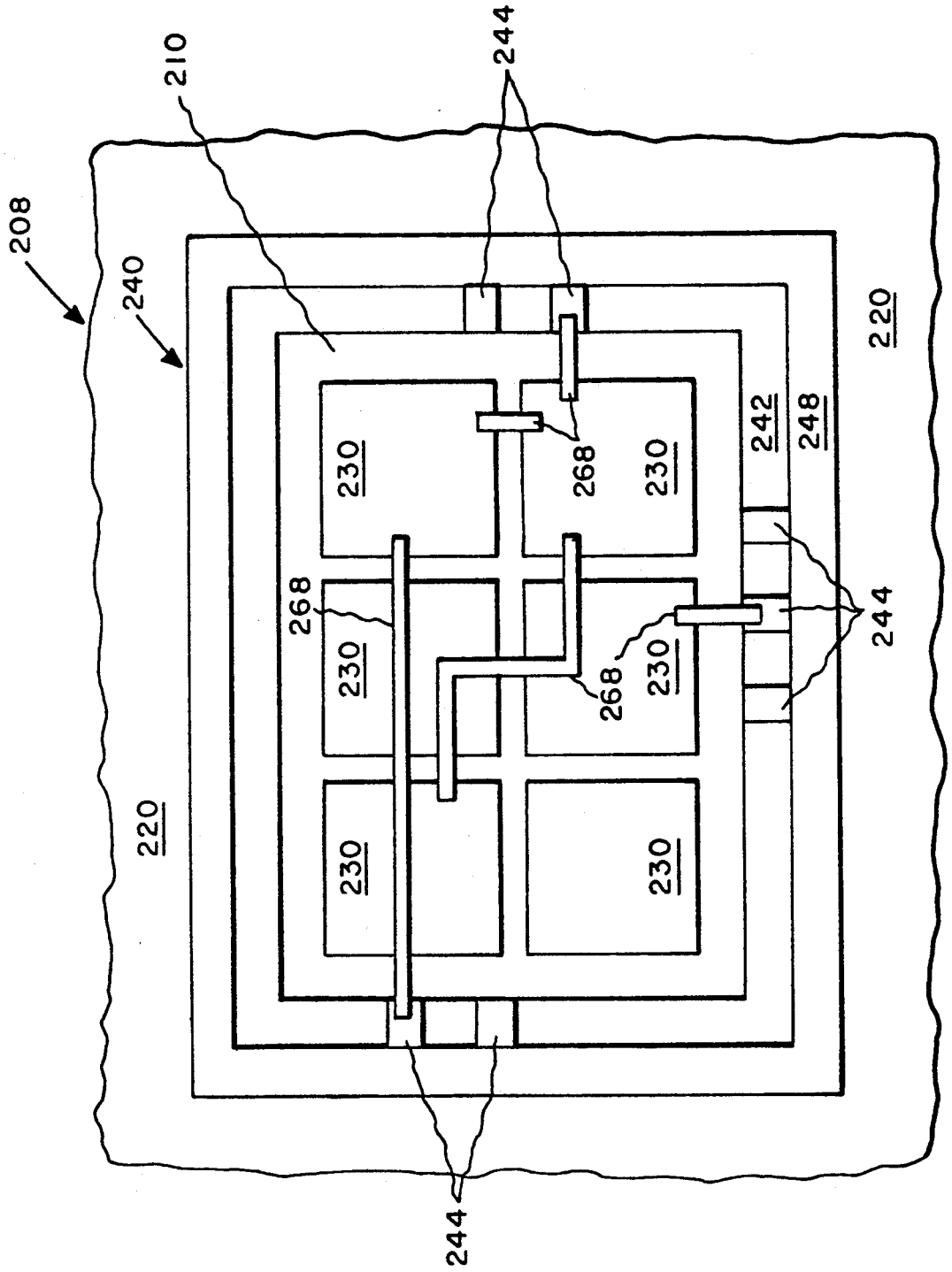

ELECTRONIC SYSTEMS DISPOSED IN A HIGH FORCE ENVIRONMENT
===

This application is a continuation of application Ser. No. 07/586,330, filed Sep. 18, 1990, abandoned, which is a continuation of application Ser. No. 07/374,890, filed Jul. 3, 1989, now abandoned.

BACKGROUND OF THE INVENTION

1. Field of the Invention

The present invention relates to the field of electronic systems, and more particularly, to high acceleration objects containing electronic systems.

BACKGROUND INFORMATION

Modern electronic systems normally include integrated circuits. Integrated circuits themselves are substantially unaffected by high accelerations such as 20,000 g to 100,000 g or higher, where "g" is the acceleration due to gravity, since they are monolithic, relatively small, low mass structures. Consequently, such integrated circuits themselves are suitable for use in high acceleration objects such as rockets, systems which are launched as projectiles and so forth. Integrated circuits are normally connected into a larger electronic system by packaging them in packages which help to protect the integrated circuit and facilitate connecting them into the larger electronic system. Normally, the integrated circuit is connected to package conductors by wire bonds and after mounting of the integrated circuit, the package is hermetically sealed by a metallic lid which spans the cavity in which the integrated circuit and its wire bonds are disposed.

Unfortunately, when such packages are exposed to accelerations on the order of 20,000 g or more, the wire bonds collapse against the integrated circuit and the package (the lid is also deformed inward into contact with the wire bonds and/or contact pads) creating short circuits and breaking some of the wires. Both of these effects disable the integrated circuit and the electronic system in which it is connected. Consequently, for use in high acceleration environments, an electronic system must be free of wire bonds which can be damaged by that high acceleration.

There is a need in high acceleration objects for electronic systems which can withstand high accelerations, both while they are not in operation and while they are in active operation.

OBJECTS OF THE INVENTION

Accordingly, a primary object of the present invention is to provide a high acceleration object with an electronic system which can survive the high accelerations the object is intended to undergo.

Another object is to provide an electronic system which is fabricated at all levels in a manner to withstand high accelerations.

Still another object of the invention is to provide a high acceleration object with an electronic system which is free of wire bonds.

SUMMARY OF THE INVENTION

The above and other objects which will become apparent from the specification as a whole, including the drawings, are accomplished in accordance with one embodiment of the present invention by interconnecting integrated circuits in a high acceleration object with a high density interconnect system in which a dielectric layer is disposed over the integrated circuits and any gaps between them and supports conductors which interconnect the integrated circuits of the system in a manner which is immune to acceleration induced damage for accelerations in the range from 20,000 g to 100,000 g and higher.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 8 is a plan view of a modified embodiment of the FIG. 4 structure.

DETAILED DESCRIPTION

Figure 1:
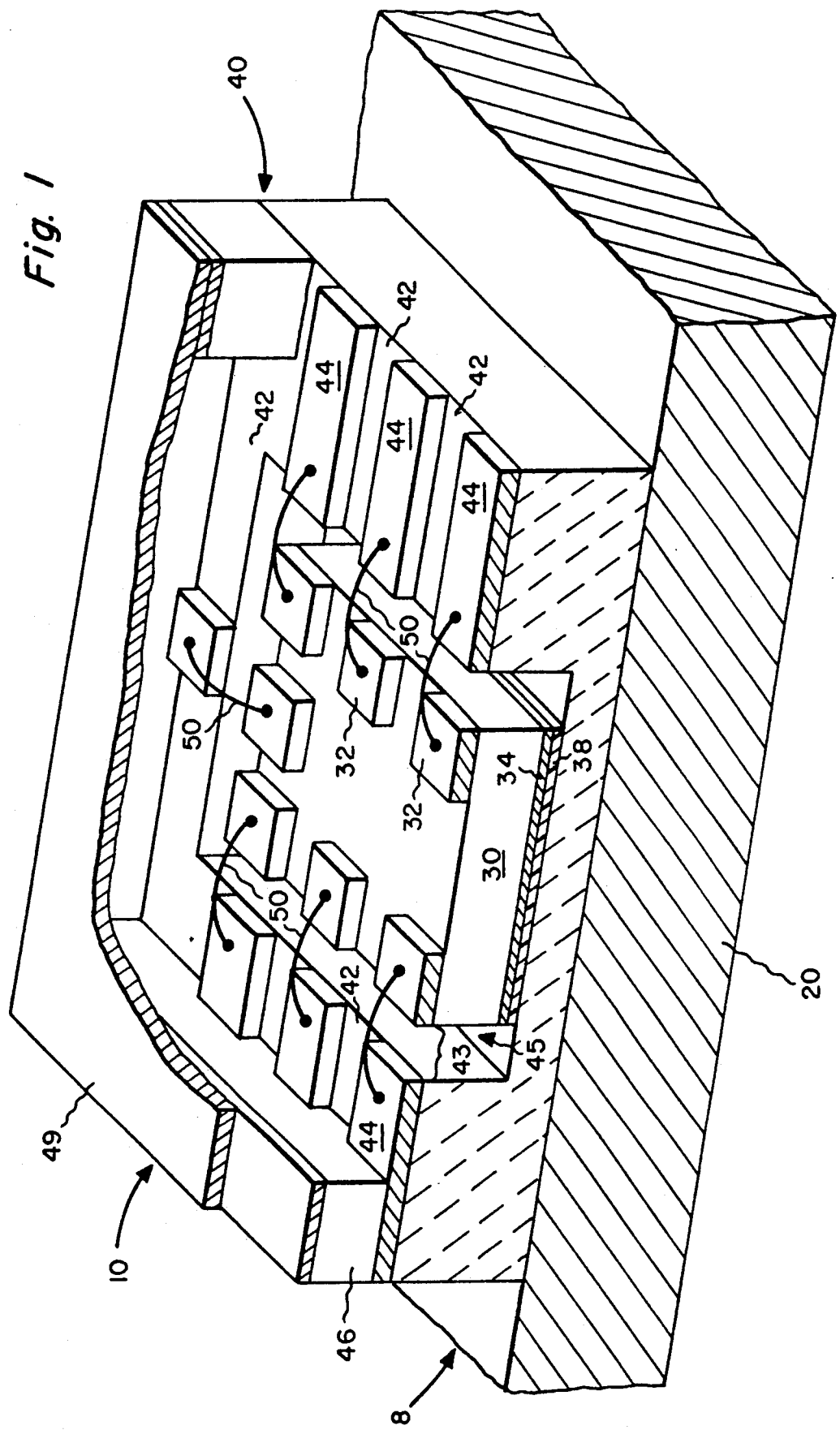
FIG. 1 is a perspective cross-section view of a portion of a prior art electronic system disposed in a mobile object.

In FIG. 1, an object 8, including an electronic system 10, comprises a structural portion 20 of the object, an integrated circuit 30 and a package 40 in which the integrated circuit is packaged. The integrated circuit 30 has a plurality of contact pads 32 disposed on an upper surface thereof and a back metallization 34 disposed on a back or lower surface thereof. This integrated circuit is mounted in a package 40 by a solder or adhesive layer 38. The package 40 includes a shoulder or plateau 42 on which are disposed conductive runs or lands 44 to which the contact pads 32 of the integrated circuit are connected by wire bonds 50. The package 40 is a typical prior art package designed for use with wire bonds to connect the integrated circuit to the package conductors. Typically, the recess 45 in which the chip 30 is disposed is 400 mils (10.2 mm) square and the chip is 350×370 mils (8.9×9.4 mm). Thus, where the chip 30 is centered in the recess 45, a gap of between 15 and 25 mils (0.38–0.63 mm) exists between the edge of the chip 30 and the shoulder 42 of the package. This gap is easily bridged by the wire bonds 50.

It will be understood that the manner in which the package contact lands 44 extend to the outside of the package and the type of lead provided on the outside of the package varies in accordance with the type of package. As is well known in the integrated circuit art, the term "wire bonds" is a term of art referring to fine wires which have one end solderless bonded to a contact pad of one portion of an electronic structure and the other end solderless bonded to a contact pad of another portion of the structure. "Wire bonds" are sometime referred to as "nail head bonds" because of an enlargement of the wire at the end thereof at which the first bond of a wire bond is formed or wedge bonds in which the wire is crushed in spots to form the solderless bond. "Solderless bonded" means without solder and usually involves thermocompression bonding or ultrasonic bonding. The wire bond wires 50 for low power integrated circuits are typically 1 mil (25 microns) in diameter and 0.3–0.4 inch (0.76–1.27 cm) long. These are delicate wires which are adequate for use in normal fixed or low acceleration objects. However, when subjected to shock or high accelerations, the wire bond wires 50 are easily bent or deflected.

Figure 2:
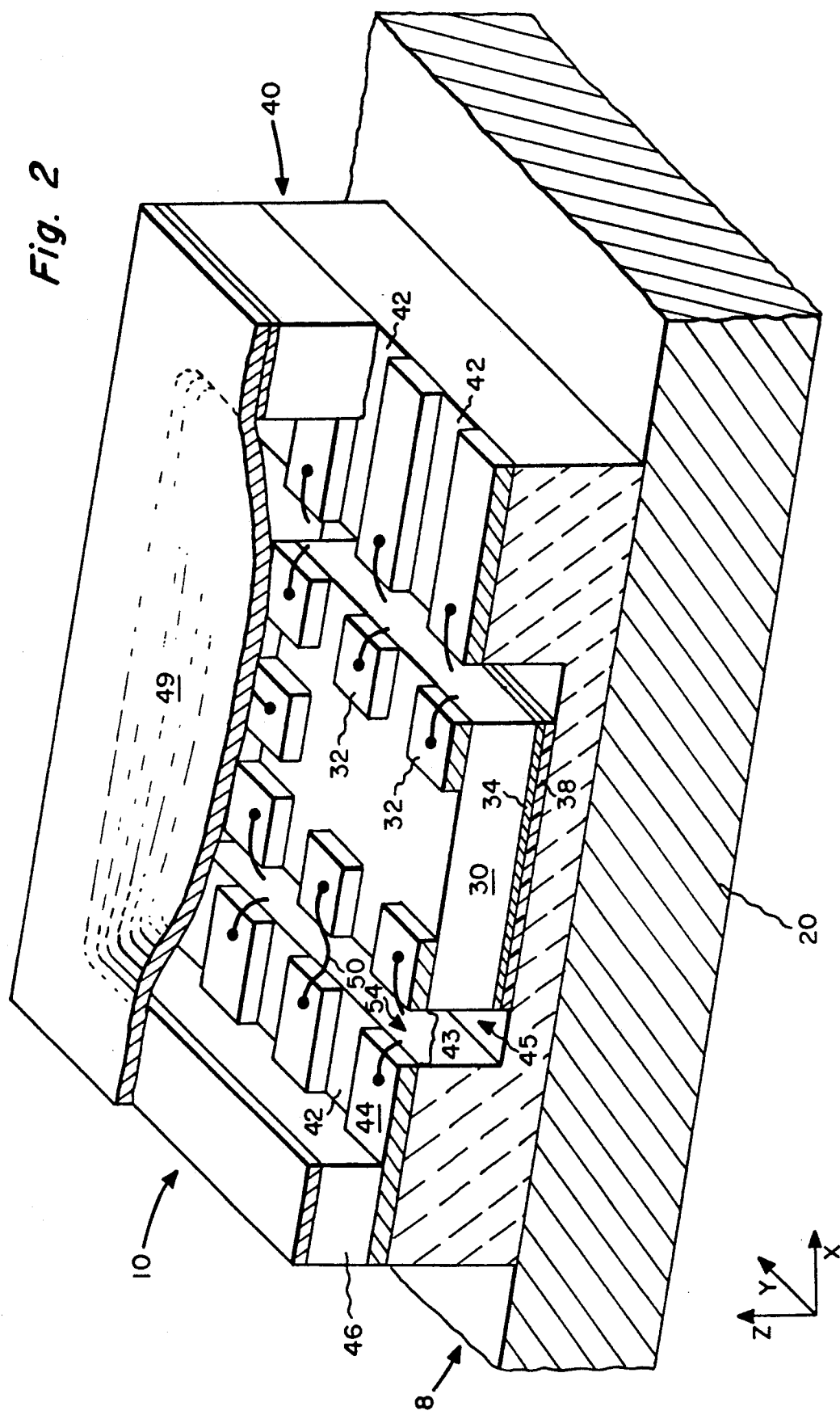
FIG. 2 illustrates the prior art system of FIG. 1 after exposure to high acceleration or shock in the upward direction.

Object 8 is illustrated in FIG. 2 following exposure to a high acceleration (greater than about 30,000 g) in the positive Z-direction in FIG. 2. As can be seen, all of the wire bond wires 50 within the package 40 have been bent down in the negative Z-direction in a manner which creates short circuits and breaks some of the wires 50 as at 54 where they extend across the gap 43 between the integrated circuit 30 and the package shoulder 42. Even in an absence of the gap 43, short circuits would result from the collapse of the wire bond wires. Further, the package lid 49 has been stretched and deformed downward in the figure in a manner in which it contacts and shorts contact pads 32 of the integrated circuit and the bond wires 50. These broken wires and short circuits disable the electronic system 10 or parts of it.

A high acceleration in the XY plane bends the bond wires substantially into the XY plane and causes failures due to bond wire breakage, bond wires contacting contact pads from which they should be isolated, and so forth. Similarly, a high acceleration in the negative Z direction stretches the bond wires upward breaking or dislodging some of them. The lid also bows outward. Thus, failure modes are present in wire bond systems in response to high acceleration in any direction, although the acceleration at which failures first occur may vary with the orientation of the package relative to the direction of acceleration. For these reasons, wire bonding is not an acceptable connection technique for electronic systems for use in high acceleration environments.

Figure 3:
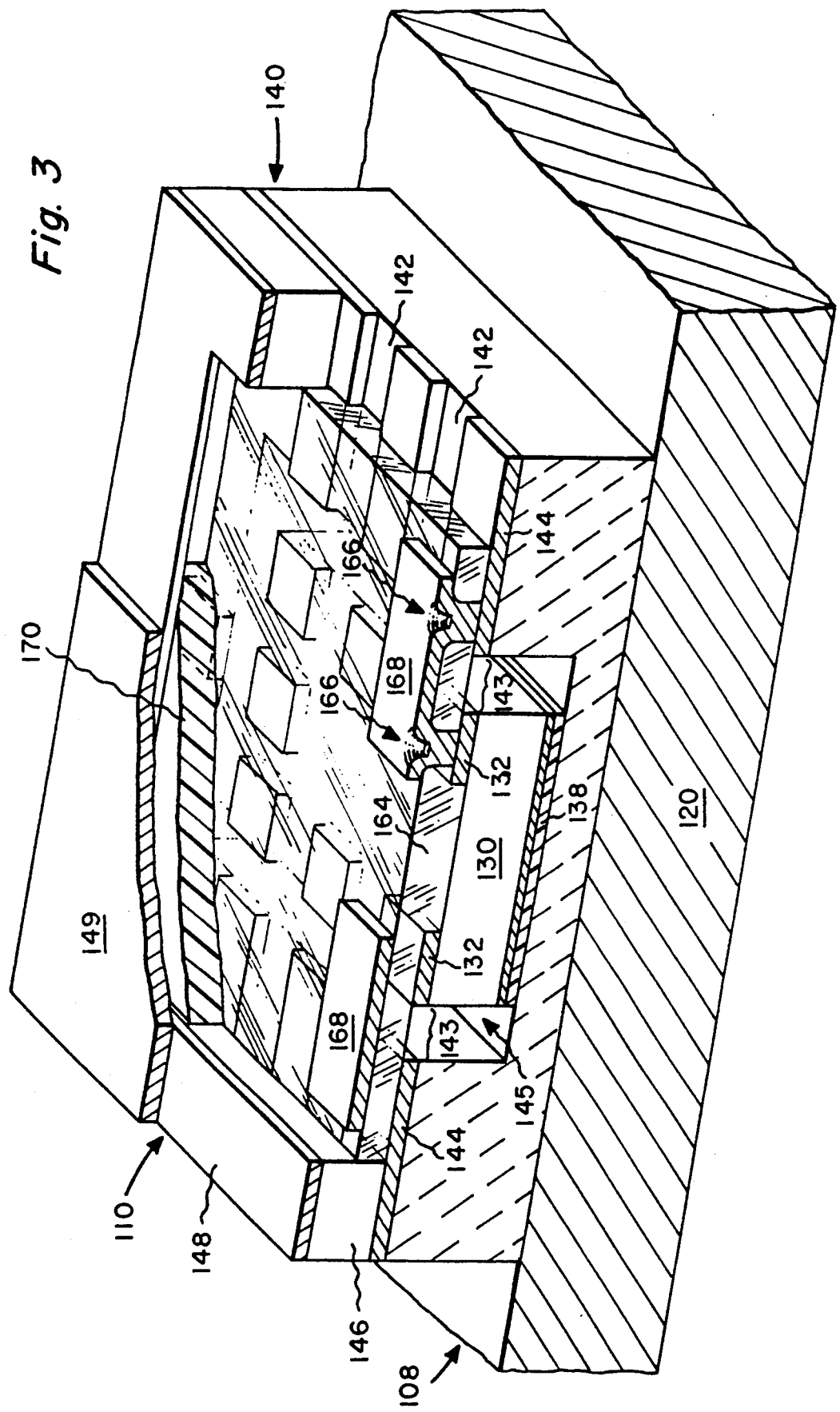
FIG. 3 is a perspective, cross-section partially cut away view of a high acceleration object including an electronic system in accordance with the present invention.

In FIG. 3, a high acceleration object in accordance with the present invention including electronic circuitry 110 therein is shown generally at 108. In FIG. 3, reference numerals in the one hundreds are utilized. Those reference numerals ending in the same two digits as reference numerals in FIGS. 1 and 2 identify corresponding structures and may not be discussed at this point. For the function or purpose of those structures not discussed at this point, the reader is referred to the earlier discussion of the similar structures in FIGS. 1 and 2. The package 140 is like the package 40, however, the method and structure which is used to connect the integrated circuit contact pads 132 to the package contact lands 144 is vastly different. A high density interconnect system such as that disclosed in U.S. Pat. No. 4,783,695, entitled "Multichip Integrated Circuit Packaging Configuration and Method" issued in the name of C. W. Eichelberger et al. is used to connect the chip contact pads 132 to the package lands 144. A method of forming that structure is disclosed in copending application Ser. No. 240,367, filed Aug. 30, 1988, as a continuation of application Ser. No. 912,458 filed Sep. 26, 1986, and entitled "Method and Apparatus for Packaging Integrated Circuit Chips Employing a Polymer Film Overlay Layer". Both of these documents are incorporated herein by reference.

In FIG. 3, a polymer dielectric layer 164 is disposed over the integrated circuit chip 130 and over the shoulder 142 of the package 140. This dielectric layer bridges or spans the gap 143 between the integrated circuit and the shoulder 142 of the package. The dielectric layer covers the contact pads 132 on the integrated circuit and at least the portion of the contact lands 144 nearest the integrated circuit. A via hole 166 is provided in the dielectric layer 164 at each location where it is desired to have one of the conductors 168 which are disposed on the upper surface of the dielectric layer 164 make electrical contact to an underlying chip contact pad 132 or package contact land 144. In FIG. 3, only a single dielectric layer 164 and a single layer of conductors 168 is illustrated for clarity in the drawing. Where necessary, or desirable, additional dielectric layers may be disposed over the layer 164 and additional conductor layers may be disposed over those dielectric layers. Connections are made between subsequent conductor layers and the layer 168 through via holes in the overlying dielectric layer. A block 170 of solid dielectric material is disposed between the lid 149 and the high density interconnect system disposed on integrated circuit 130.

The dielectric layer 164 bridges the gap 143 between the edge of the semiconductor chip 130 and the package shoulder 142 and supports the conductor 168 over this gap. Typically, the dielectric layer 164 is a KAPTON ® polyimide film which is available from DuPont de Nemours Company and is preferably 1–2 mils (25–50 microns) thick. The conductors 168 are preferably copper films 0.1–0.5 mils (2–10 microns) thick (ideally about 5 microns thick) with an adhesion promotion layer such as titanium or tungsten adjacent the dielectric film 164. Such a conductor 1 mil (25 microns) wide and 25 mils (635 microns) long has a mass of only about $0.73 \times 10^{-6}$ grams. As such, the force on such a conductor undergoing 100,000 g acceleration is only about 6.4 pounds per square inch (psi). That force is sufficient to deflect the dielectric film 164 and conductor 168 in the general manner illustrated in FIG. 4 in the vicinity of the gap 143. This deflection is within the elastic tolerance of both the dielectric film 164 and the ductile copper conductor 168 (of about 30%). Consequently, the integrated circuit 130 and its connection to the package contact lands 144 are not adversely affected by 100,000 g accelerations. Unfortunately, the same cannot be said for the package lid 149, which in the prior art, typically has an unsupported span of 1 to 2 inches (25–50 mm), which for a steel package lid 10–20 mils thick results in a force in excess of 640 psi on the center of the lid at 100,000 g acceleration. Consequently, in the absence of dielectric block 170, the lid would deform in the same manner as illustrated in FIG. 2. That deformation of the lid could result in short circuits between the lid and the conductors within the package in the absence of the dielectric block 170. To prevent this adverse effect, the solid dielectric block, layer or pad 170 disposed within the package between the chip and the lid should have sufficient strength to support (at least partially) the lid under high acceleration and to thereby ensure that even in the deformed state of the lid, the integrated circuit and the conductors thereon are electrically insulated from the lid. The dielectric block 170 should have a sufficient stiffness (durometer reading) to survive the acceleration and continue to hold the lid out of contact with the chip 130 and the wiring thereover. Since the connection structure is itself crush resistant, this ensures survival and continued operation of the electronic system 110 of which the integrated circuit 130 forms a part.

A silicone rubber pad may be used as the solid dielectric buffer between the integrated circuit chip and the inside of the package lid provided a buffer polyimide layer is disposed between that silicone rubber pad and any exposed polyimide films of the packaging structure in order to isolate the package polyimide films from the silicone rubber pad. The silicone rubber pad helps to support the package lid 149 and ensures that even if the lid is severely deformed by acceleration, that lid does not come into contact with the conductors of the high density interconnect structure. This ensures, that even in a deformed state, the lid will not render the electronic system inoperative.

The accelerations which the resulting object and its electronics can withstand can be maximized by tailoring the recess 145 to match the actual chip size, thereby minimizing the gap between the chip and the package shoulder or by filling the gap 145 with a dielectric material such as the ULTEM polyetherimide material discussed hereinafter as an adhesive for the KAPTON polyimide film. Either of these techniques reduces both the unsupported span across which the dielectric layer 164 extends and the mass of the dielectric layer and the conductors extending across this gap.

Figure 4:
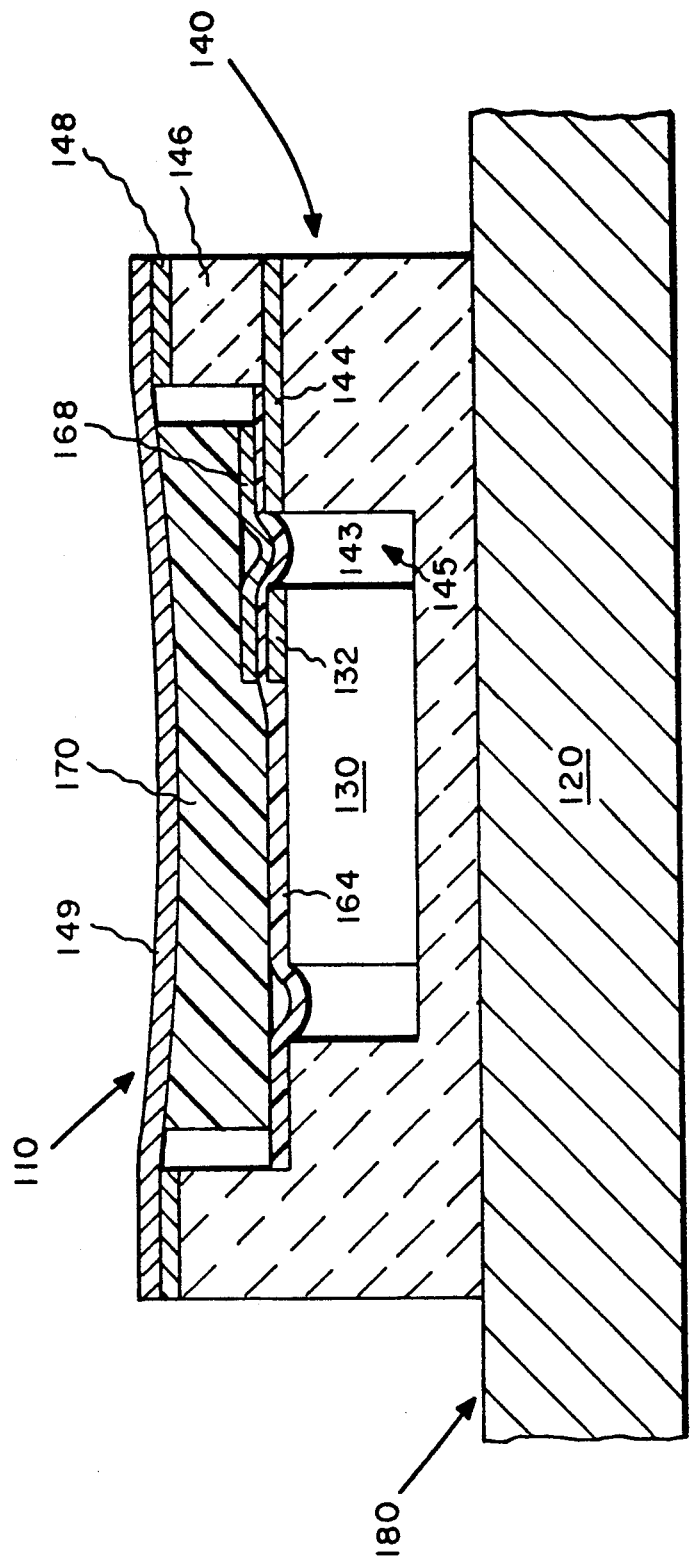
FIG. 4 is a cross-section view of the FIG. 3 structure during high acceleration.

It will be noted that in the FIG. 3 and 4 structure, the dielectric layer 164 is recessed within the package below the sealing ring 148 of the package. The height of the sidewall portion 146 of the package in prior art packages, is typically 50-80 mils (1.25-2 mm) and is determined by the expected height to which the wire bond wires 50 of FIG. 1 extend above the shoulder 42 of that prior art package. This height or depth is substantially larger than is required with the high density interconnect system since the high density interconnect system provides a substantially planar connection structure. The method of fabricating the interconnect structure in the package 140 will now be discussed in connection with FIGS. 5-7.

As illustrated and described in U.S. Pat. No. 4,783,695 and patent application Ser. No. 240,367, now U.S. Pat. No. 4,933,042 referred to above, a high density interconnect structure is preferably formed on a flat substrate containing recesses for the integrated circuit chips whose depth is selected to dispose the upper surface of the integrated circuits in substantially the same plane as the upper surface of the substrate on which conductors are disposed. This facilitates the lamination of the first dielectric layer across the integrated circuit chips and the substrate. The substrate is preferably a ceramic such as alumina ($Al_2O_3$).

The polyimide film 164 cannot be applied in the small cavity of this package using the specific techniques illustrated and described in the U.S. patent application Ser. No. 240,367 referred to above. This is because of the relatively small surface area of the cavity and the relatively large height of the sidewall portion 146 of the package around that cavity. Attempts to apply the film 164 as part of a larger film result in tearing or separation of the polyimide film as a result of exceeding its elastic limit or a failure of that film to come into proper contact with the chip 130.

In accordance with the present invention, this problem is overcome by cutting an individual piece of the polyimide film to fit within the cavity and applying the bonding pressure thereto via a high temperature elastic pressure block 167 (FIG. 6) which may preferably be made of high temperature silicone rubber.

Figure 5:
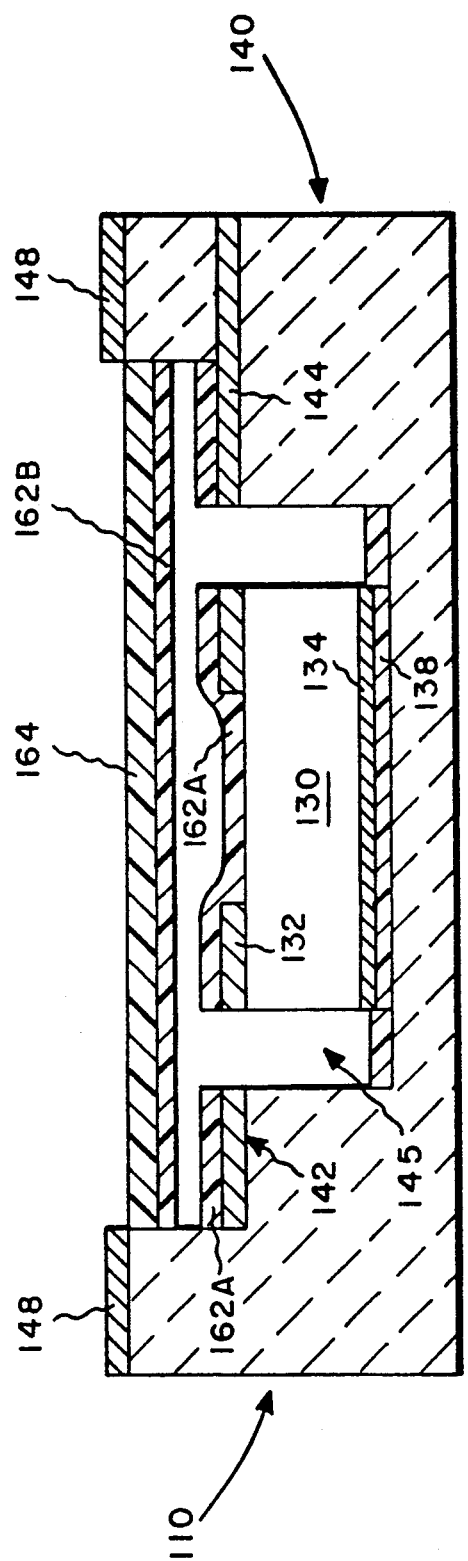
FIGS. 5-7 illustrate steps in the process of fabricating the structure of FIG. 4.

In FIG. 5, the chip 130 has been bonded to the bottom of the recess 145 in the package by use of an adhesive or solder 138, depending on the preferred bonding technique for the package in question. A glue layer 162A has been deposited on the upper surface of the chip 130, including its contact pads 132, and on the shoulder 142 and the contact lands 144 of the package 140 and at the bottom of the recess 145 between the chip and the package shoulder. This adhesive is preferably a polyetherimide available from General Electric Company under the trade name ULTEM 1000® and is deposited by spraying a solvent solution as taught in U.S. Pat. No. 4,783,695 entitled, "Multichip Integrated Circuit Packaging Configuration and Method" and U.S. patent application Ser. No. 312,536 filed Feb. 17, 1989, as a continuation-in-part of U.S. patent application Ser. No. 156,318, filed Feb. 16, 1988, and entitled, "Method of Bonding a Thermoset Film to a Thermoplastic Material to Form a Bondable Laminate". The spray solution preferably comprises 10% by weight ULTEM 1000®, 50% by weight acetophenone and 40% by weight methylene chloride. This solution is sprayed onto the integrated circuit and the package shoulder while masking the sealing ring portion 148 of the package. Consequently, the glue layer 162A is typically also disposed at the bottom of the recess 145 between the chip 130 and the shoulder 142 of the package and may also be disposed on the sidewalls of the cavity 145 and the chip 130. The glue in the bottom of this recess does not present any problems, but also is not involved in the bonding of the dielectric layer 164. A piece of a polyimide film 164 which may preferably be KAPTON® is cut to fit within the sealing ring 148 and to cover substantially all of the shoulder 142 of the package. A layer 162B of the same glue is applied to what will be the lower side of this polyimide film 164 and dried. In both cases, the drying may preferably be done at a temperature of 160° C. for a period of approximately 5 minutes and then at a temperature of 290° C. for approximately 5 minutes. This drying is to remove the acetophenone and methylene chloride solvent in which the desired ULTEM 1000® is dissolved for spray application. After both glue layers are dried, the polyimide layer is inserted in the cavity of the package in preparation for bonding this polyimide film to the integrated circuit chip 130 and the shoulder portion 142 of the package.

Figure 6:
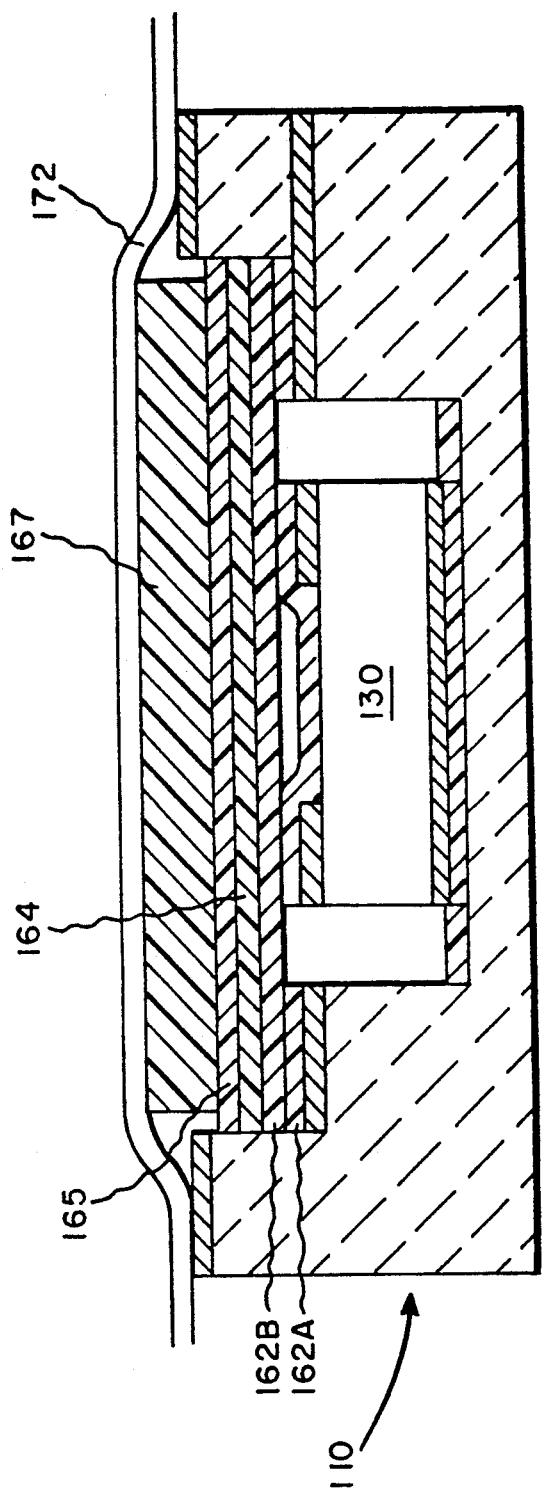

In order to bond the film 164 in place, a high temperature silicone rubber pressure pad 167 which has been cut to fit the cavity of the package is placed over the film 164 and a buffer polyimide film 165 (FIG. 6). The buffer layer 165 of polyimide film is included between the polyimide film layer 164 and the silicone rubber pressure pad 167 because silicone rubber is known to poison polyimide films at high temperatures (above about 200° C.). This poisoning is believed to be due to a reaction between the polyimide film and the silicone rubber. The buffer polyimide film layer protects the package polyimide film 164 from contact with the silicone rubber and thereby prevents deterioration of the package polyimide film 164.

The structure is placed in a bonding furnace which is evacuated to eliminate air from within the gap between the integrated circuit and the package shoulder. The film 164 is bonded to the device and package by slowly heating the structure to the vicinity of 250° C. and by applying a pressure of 30 psi to the upper surface of the silicone rubber pad 167 by use of bladder membrane 172. The heating is stopped while the pressure is maintained until the structure cools to the vicinity of 100° C. Under these conditions, the adhesive layers 162A and 162B merge to form a single adhesive layer where they are disposed in contact with each other and they permanently bond the polyimide layer 164 to the chip 130 and package 140. If it is desired to remove that polyimide film 164 at a later time, it may be removed by heating the structure to the vicinity of 250° C. and lifting the polyimide film off the chip and package. A residue of the ULTEM ® polyetherimide layer is left on the chip and package after such removal, but may be removed by appropriate solvents such as a mixture of acetophenone and methylene chloride. Once the package, chip and dielectric layer 164 have cooled, the silicone rubber pressure pad 167 and the buffer polyimide film 165 are removed from the package. Interconnections between the chip pads and the package contact lands are then formed in the standard method for the high density interconnect system as disclosed in U.S. Pat. No. 4,783,695 referred to above.

Figure 7:
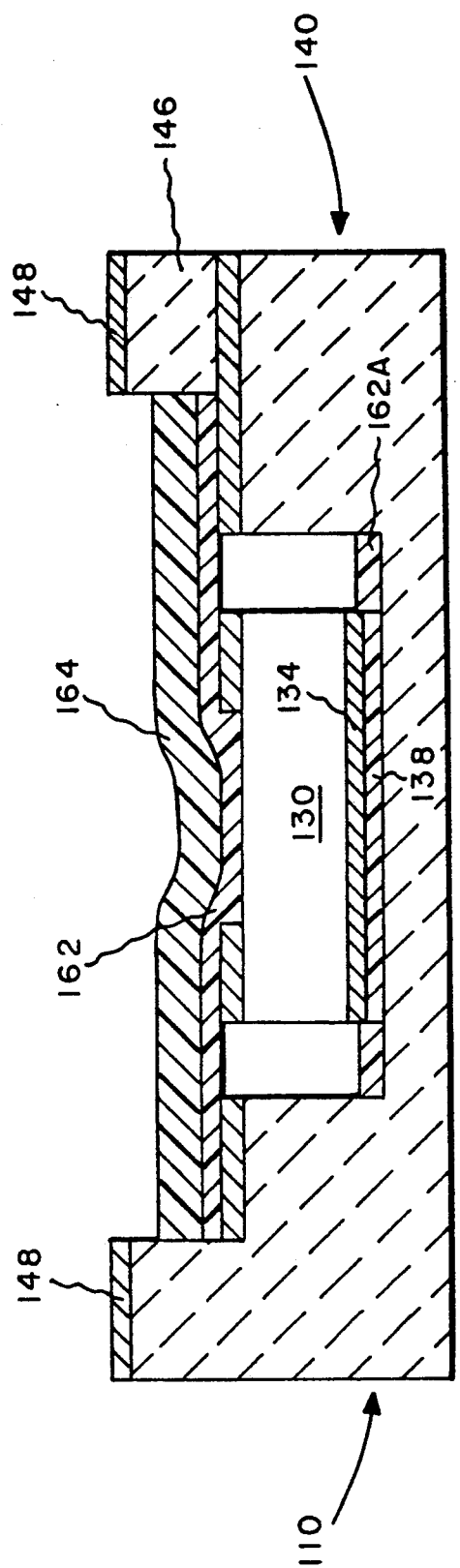

In FIG. 7, the chip and package are illustrated after bonding of the polymer film to the chip and package and removal of the silicon rubber pad 167 and the buffer polyimide layer 165. The two adhesive layers 162A and 162B have merged into a single layer 162.

To complete the package, conductors 168 are formed on the dielectric layer, the insulating pad 170 is disposed in the package cavity on top of the high density interconnect structure and the package is sealed by lid 149 (FIG. 3). The completed package 140 and the remainder of the electronic system 110 are then mounted in the object 108 on structural member 120.

Thus far, the discussion of this structure has been in terms of a single integrated circuit disposed in a package and FIGS. 1-7 each illustrate only a single integrated circuit for clarity. This technique and structure is equally applicable to multiple integrated circuits 230 packaged in a single package 240 as shown in FIG. 8 in plan view with the cover removed. The integrated circuits 230 may preferably be placed as close together as possible, essentially edge-to-edge. This provides several advantages. First, the connections between chips are kept as short as possible. Second, the gap which must be spanned by the dielectric layer 264 (not shown) is minimized, thereby maximizing the acceleration forces which the dielectric layer 264 and the conductors 268 thereon can survive. The dielectric layer 264 is preferably applied in the same manner as discussed above and the interconnection metallization is formed in the standard way. As can be seen, the integrated circuits 230 are connected to contact lands 244 of package 240 and to each other by conductors 268 disposed on the dielectric layer 264 (not shown). The conductors 268 make contact with the underlying conductors through via holes in the dielectric layer. Additional dielectric and metallization layers may be applied if needed because of the complexity of the interconnections among the integrated circuit and the package contact lands.

As can be seen, the high acceleration object 110 is free of wire bonds. As a result, the electronic system can operate continuously from a period where the object 110 is at rest, through a high acceleration of up to 100,000 g or more, through a period of constant velocity operation, through a period of deceleration and into a second period of at rest operation.

It is preferred to mount the electronic system so that its greatest acceleration is in the upward (positive Z-direction) in the figures. Thus, the Z axis is a reference axis which is disposed parallel to the expected direction of the application of the unbalanced forces which it is desired to prevent from damaging the electronic system. The high density interconnect system of connections is substantially insensitive to the direction of acceleration. However, the bond holding the chip to the package and the semiconductor chip itself may be fractured by excessive accelerations in the XY plane or in the negative Z-direction. Further, the package itself may come loose from its mountings under such accelerations. The glue 162A at the bottom of the gap 143 can aid in retaining the chip in place. Filling the gaps with glue further secures the chips. Thus, the overall structure of the object itself and the orientation and mounting of the electronic system as a whole and its individual components themselves must be carefully designed to withstand the expected magnitude and direction(s) of accelerations which the electronic system must survive. With an electronic system in accordance with these teachings, that design becomes possible whereas with the wire bond connected integrated circuits of the prior art, that design is not possible.

The package and sidewall 146 and the lid 149 may be omitted if a hermetic seal is not required. In that case, the circuit is packaged essentially in the manner taught in U.S. Pat. No. 4,783,695.

The overall electronic system includes appropriate voltage sources such as solar cells, batteries, fuel cells or capacitors which store or provide sufficient charge to operate the electronic system during acceleration and subsequent thereto. For some systems, the desired period of operation is short enough that a battery or other power supply may be used as a source of pre-acceleration power and ceramic or other acceleration-surviving capacitors may be used to provide the power to continue system operation during and after acceleration where the battery or initial primary power source fails during acceleration.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A high density interconnect structure comprising:
  a package base having a cavity therein including a recess in the bottom of the cavity in which a semiconductor chip having contact pads thereon is disposed, said package base including contact lands disposed on a shoulder within said cavity adjacent said recess, said contact pads and said contact lands being disposed in substantially a common plane;
  a polymer dielectric layer about 1-2 mils thick disposed on the exposed major surface of said semiconductor chip and on said contact lands and extending across any gap between said chip and said shoulder;
  a plurality of via holes in said dielectric layer disposed in alignment with selected ones of said contact pads of said semiconductor chip and said contact lands of said package;
  a plurality of conductors disposed on said polymer dielectric layer interconnecting selected ones of said chip contact pads and said package contact lands and extending into appropriate ones of said via holes to provide those connections;

said polymer dielectric layer and said interconnecting conductor pattern being recessed within the cavity of said package.

2. The structure recited in claim 1 further comprising a package lid bonded to said package base to hermetically enclose said semiconductor chip, said dielectric layer and said interconnecting conductors within said package.

3. The structure recited in claim 2 further comprising:
a solid dielectric block between said semiconductor chip and said lid extending from said polymer dielectric layer and said conductors to said lid to at least partially support said lid.

4. The structure recited in claim 1 wherein:
there is a gap between said chip and said shoulder; and said dielectric layer is unsupported where it spans said gap.

5. The structure recited in claim 4 wherein:
the portions of said plurality of conductors which span said gap are about 0.1–0.5 miles thick whereby said dielectric layer is capable of supporting the portions of said conductors which span said gap while experiencing said unbalanced forces in excess of those induced by an acceleration of 20,000 g to prevent short circuit faults, open circuit faults and other unacceptable conductor degradation.

6. The structure recited in claim 1 wherein:
said polymer dielectric layer has a substantially uniform thickness.

7. The high density interconnect structure recited in claim 1 wherein:
said contact lands are integral with external conductors of said package.

8. The structure recited in claim 1 wherein:
there is a gap between said chip and said shoulder; and which further comprises
a dielectric material filling the gap.

* * * * *